US012442076B2

(12) United States Patent
Hatanpää et al.

(10) Patent No.: US 12,442,076 B2
(45) **Date of Patent: *Oct. 14, 2025**

(54) METHOD AND SYSTEM FOR DEPOSITING NOBLE METAL-CONTAINING LAYER

(71) Applicant: ASM IP Holding B.V., Almere (NL)

(72) Inventors: Timo Hatanpää, Espoo (FI); Anton Vihervaara, Helsinki (FI); Mikko Ritala, Espoo (FI)

(73) Assignee: ASM IP Holding B.V., Almere (NL)

( * ) Notice: Subject to any disclaimer, the term of this patent is extended or adjusted under 35 U.S.C. 154(b) by 0 days.

This patent is subject to a terminal disclaimer.

(21) Appl. No.: 18/438,612

(22) Filed: Feb. 12, 2024

(65) Prior Publication Data

US 2024/0279805 A1 Aug. 22, 2024

Related U.S. Application Data

(60) Provisional application No. 63/445,321, filed on Feb. 14, 2023.

(51) Int. Cl.

| | |
|---|---|
| ***C23C 16/455*** | (2006.01) |
| ***C23C 16/08*** | (2006.01) |
| ***C23C 16/44*** | (2006.01) |

(52) U.S. Cl.

CPC ........ *C23C 16/45553* (2013.01); *C23C 16/08* (2013.01); *C23C 16/4408* (2013.01)

(58) Field of Classification Search

None

See application file for complete search history.

(56) References Cited

U.S. PATENT DOCUMENTS

| | | | | |
|---|---|---|---|---|
| 12,065,739 | B2 * | 8/2024 | Hatanpää | ............ C23C 16/4408 |
| 2015/0004314 | A1 | 1/2015 | Winter | |
| 2019/0249300 | A1 * | 8/2019 | Hatanpää | .......... H01L 21/76879 |

OTHER PUBLICATIONS

Hamalainen, J et al. "Atomic Layer Deposition of Noble Metals and Their Oxides". Chem Mater. 2014, 26. pp. 786-801 (2013). (Year: 2013).*

Reductive Thermal Atomic Layer Deposition Process for Gold, A. Vihervaara et al., https://doi.org/10.1021/acsmaterialsau.2c00075, ACS Materials.

* cited by examiner

*Primary Examiner* — Alexander M Weddle

(74) *Attorney, Agent, or Firm* — Laine IP Oy; Mark W. Scott

(57) ABSTRACT

The present disclosure relates to methods and apparatuses for depositing noble metal-containing material on a substrate by a cyclic deposition process. The method comprises providing a substrate in a reaction chamber, providing a noble metal precursor into the reaction chamber in a vapor phase; and providing a second precursor into the reaction chamber in a vapor phase to form noble metal-containing material on the substrate. The noble metal precursor according to the disclosure comprises a noble metal halide compound comprising an organic phosphine adduct ligand.

26 Claims, 2 Drawing Sheets

METHOD AND SYSTEM FOR DEPOSITING NOBLE METAL-CONTAINING LAYER

CROSS-REFERENCE TO RELATED APPLICATIONS

Figure 1A:
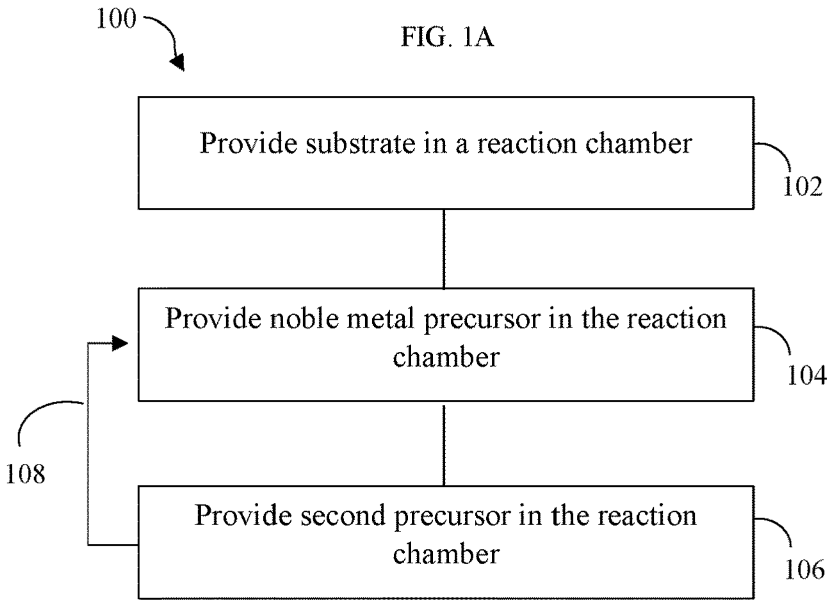

This application claims priority to and the benefit of U.S. Provisional Application No. 63/445,321, filed Feb. 14, 2023, the entirety of which is incorporated by reference herein.

PARTIES OF JOINT RESEARCH AGREEMENT

The invention claimed herein was made by, or on behalf of, and/or in connection with a joint research agreement between University of Helsinki and ASM Microchemistry Oy. The agreement was in effect on and before the date the claimed invention was made, and the claimed invention was made as a result of activities undertaken within the scope of the agreement.

FIELD OF INVENTION

The present disclosure relates to methods and apparatuses for the manufacture of semiconductor devices. More particularly, the disclosure relates to methods and apparatuses for depositing noble metal-containing material on a substrate by a cyclical deposition process, and layers comprising noble metal-containing material.

BACKGROUND OF THE DISCLOSURE

Semiconductor device manufacturing for advanced technology nodes requires high quality thin films deposited uniformly over large areas and on complex 3D structures. Cyclical deposition processes may be used for the deposition of noble metal-containing films, such as palladium-containing films, silver-containing films, and platinum-containing films. However, chemical precursors suitable for the cyclical deposition of noble metal containing films are uncommon and cost prohibitive.

Within vapor deposition technologies, thermal processes are sought after, as plasma may damage the underlying substrate material or compromise the conformality of the process. However, the development of thermal ALD processes for noble metals, such as palladium, silver and platinum, has been hindered by the lack of suitable precursors and precursor combinations. Deposition of metals by ALD is hampered by the lack of efficient reducing agents and suitable metal precursors. Accordingly, cyclical deposition methods, chemical precursors suitable for use in cyclical deposition processes and related vapor deposition apparatuses are desirable for the formation of noble metal-containing films, and particularly palladium-containing films.

Any discussion, including discussion of problems and solutions, set forth in this section has been included in this disclosure solely for the purpose of providing a context for the present disclosure. Such discussion should not be taken as an admission that any or all of the information was known at the time the invention was made or otherwise constitutes prior art.

SUMMARY OF THE DISCLOSURE

This summary is provided to introduce a selection of concepts in a simplified form. These concepts are described in further detail in the detailed description of example embodiments of the disclosure below. This summary is not intended to identify key features or essential features of the claimed subject matter, nor is it intended to be used to limit the scope of the claimed subject matter.

Various embodiments of the present disclosure relate to methods of depositing noble metal-containing material on a substrate, to a noble metal-containing layer, to a semiconductor structure and a device containing said layer, and to deposition assemblies for depositing noble metal-containing material on a substrate.

In a first aspect, a method of depositing noble metal-containing material on a substrate by a cyclic deposition process is disclosed. The method comprises providing a substrate in a reaction chamber, providing a noble metal precursor into the reaction chamber in a vapor phase, and providing a second precursor into the reaction chamber in a vapor phase to form noble metal-containing material on the substrate. In the method, the noble metal precursor comprises a noble metal halide compound comprising an organic phosphine adduct ligand.

In another aspect, a noble metal-containing layer produced by a cyclic deposition process is disclosed. The cyclic deposition process comprises providing a substrate in a reaction chamber, providing a noble metal precursor into the reaction chamber in a vapor phase, and providing a second precursor into the reaction chamber in a vapor phase to form noble metal-containing material on the substrate. In the process, the noble metal precursor comprises a noble metal halide compound comprising an organic phosphine adduct ligand.

In a further aspect, a semiconductor structure comprising a noble metal-containing layer deposited by a cyclic deposition process is disclosed. The cyclic deposition process comprises providing a noble metal precursor into the reaction chamber in a vapor phase, and providing a second precursor into the reaction chamber in a vapor phase to form noble metal-containing material on the substrate. The noble metal precursor comprises a noble metal halide compound comprising an organic phosphine adduct ligand.

In yet another aspect, a semiconductor device comprising a noble metal-containing layer deposited by a cyclic deposition process is disclosed, wherein the process comprises providing a noble metal precursor into the reaction chamber in a vapor phase, and providing a second precursor into the reaction chamber in a vapor phase to form noble metal-containing material on the substrate. In the process, the noble metal precursor comprises a noble metal halide compound comprising an organic phosphine adduct ligand.

In an additional aspect, a deposition assembly for depositing noble metal-containing material on a substrate is disclosed. The deposition assembly comprises one or more reaction chambers constructed and arranged to hold the substrate, a precursor injector system constructed and arranged to provide a noble metal precursor and a second precursor into the reaction chamber in a vapor phase, wherein the noble metal precursor comprises a noble metal halide compound comprising an organic phosphine adduct ligand. The deposition assembly further comprises a precursor vessel constructed and arranged to contain a noble metal precursor, and the assembly is constructed and arranged to provide the noble metal precursor and the second precursor via the precursor injector system to the reaction chamber to deposit noble metal-containing material on the substrate.

In this disclosure, any two numbers of a variable can constitute a workable range of the variable, and any ranges indicated may include or exclude the endpoints.

Additionally, any values of variables indicated (regardless of whether they are indicated with "about" or not) may refer to precise values or approximate values and include equivalents, and may refer to average, median, representative, majority, or the like. Further, in this disclosure, the terms "including," "constituted by" and "having" refer independently to "typically or broadly comprising," "comprising," "consisting essentially of," or "consisting of" in some embodiments. In this disclosure, any defined meanings do not necessarily exclude ordinary and customary meanings in some embodiments.

BRIEF DESCRIPTION OF THE DRAWING FIGURES

Figure 1B:
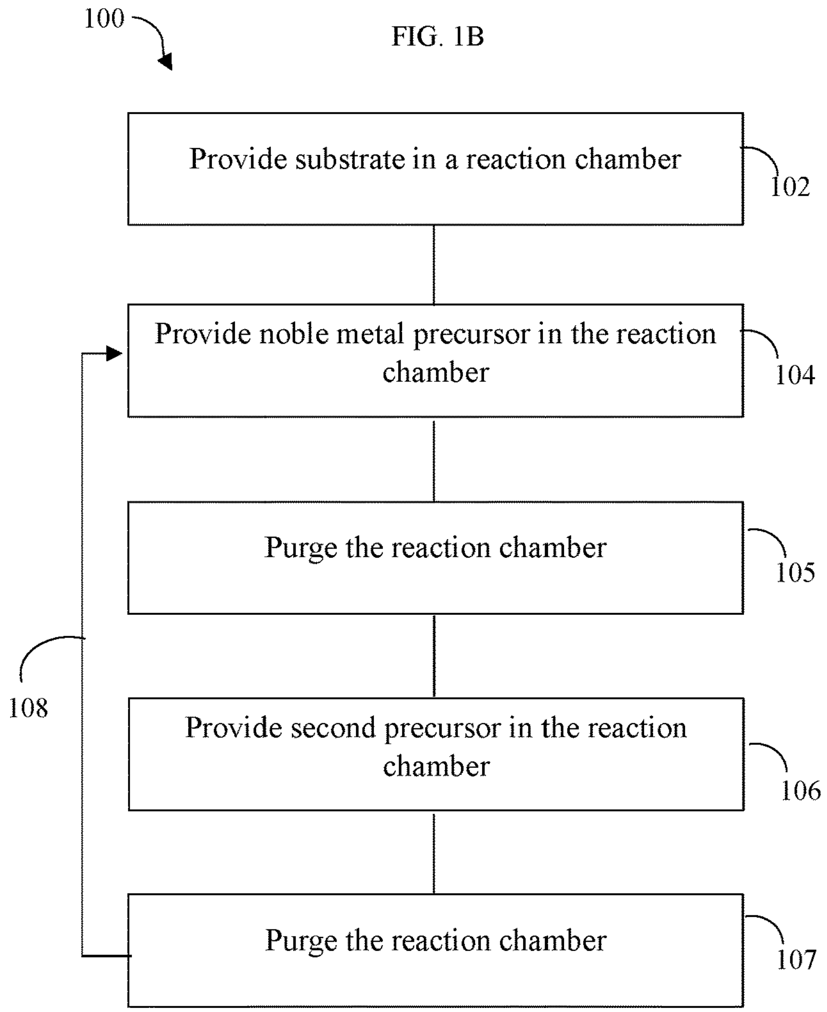

The accompanying drawings, which are included to provide a further understanding of the disclosure and constitute a part of this specification, illustrate exemplary embodiments, and together with the description help to explain the principles of the disclosure. In the drawings FIGS. 1A and 1B illustrate a block diagram of exemplary embodiments of a method according to the current disclosure.

Figure 2:
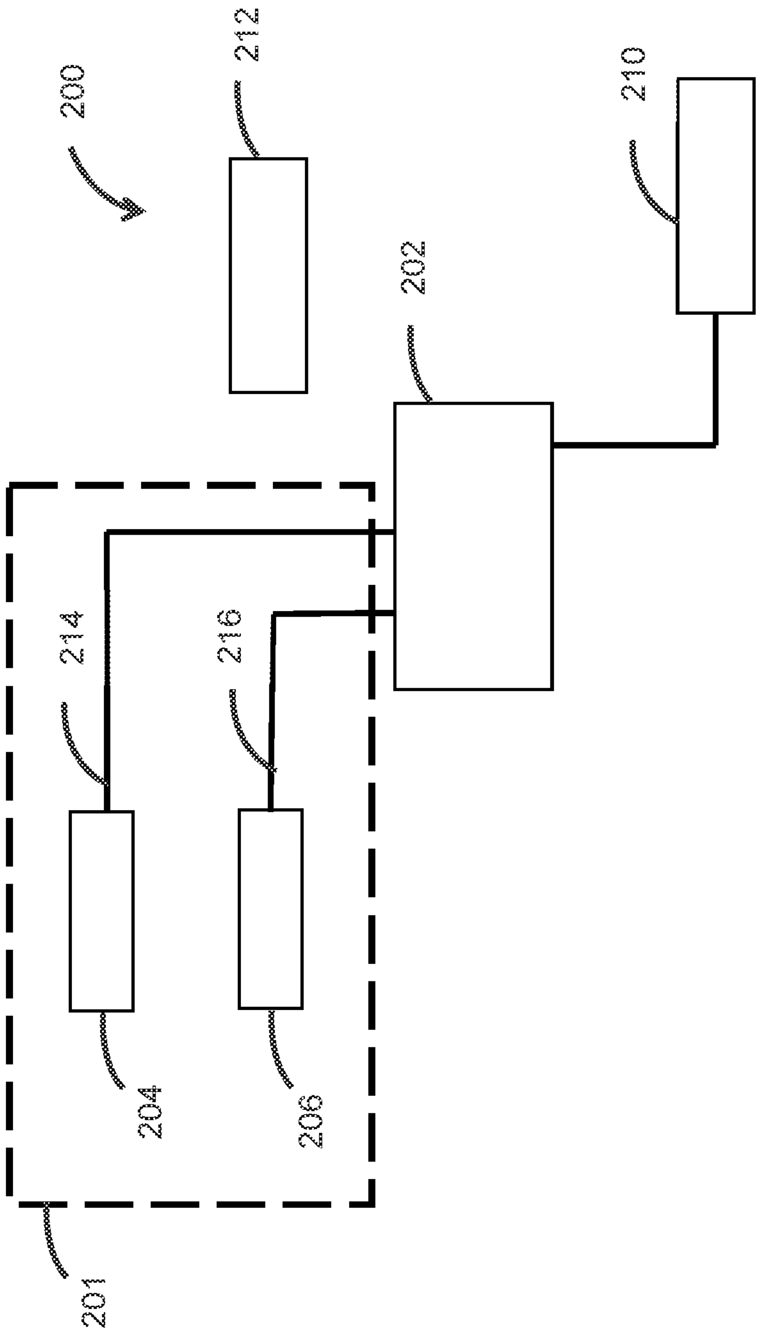

FIG. 2 is a schematic presentation of a deposition assembly according to the current disclosure.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below.

In an aspect, a method of depositing noble metal-containing material on a substrate by a cyclic deposition process is disclosed. In cyclic deposition processes, the phases of providing the noble metal precursor and providing the second precursor are repeated until a desired material thickness s achieved.

In the methods according to the current disclosure, the material deposited on a substrate comprises a noble metal. In some embodiments, the noble metal-containing material comprises palladium. In some embodiments, the noble metal-containing material comprises platinum. In some embodiments, the noble metal-containing material comprises silver. In some embodiments, the noble metal-containing material comprises elemental noble metal.

In some embodiments, the noble metal-containing material comprises a noble metal oxide. In some embodiments, the noble metal-containing material comprises a noble metal nitride. In some embodiments, the noble metal-containing material comprises a noble metal carbide. In some embodiments, the noble metal-containing material comprises a noble metal selenide. In some embodiments, the noble metal-containing material comprises a noble metal sulfide. In some embodiments, the noble metal-containing material comprises a noble metal phosphide. In some embodiments, the noble metal-containing material comprises a noble metal boride. In some embodiments, the noble metal-containing material comprises a noble metal germanide.

As used herein, the term "layer" and/or "film" can refer to any continuous or noncontinuous structure and material, such as material deposited by the methods disclosed herein. For example, layer and/or film can include two-dimensional materials, three-dimensional materials, nanoparticles or even partial or full molecular layers or partial or full atomic layers or clusters of atoms and/or molecules. A film or layer may comprise material or a layer with pinholes, which may be at least partially continuous. A seed layer may be a noncontinuous layer serving to increase the rate of nucleation of another material. However, the seed layer may also be substantially or completely continuous. A layer of desired thickness may be deposited by repeating providing a noble metal precursor and a second precursor in the reaction chamber sufficiently many times. A layer produced according to the methods disclosed herein may form a part of a semiconductor structure and/or a semiconductor device.

In a further aspect, a semiconductor structure comprising a noble metal-containing layer deposited by a cyclic deposition process is disclosed. The cyclic deposition process is performed as described herein, and the process is integrated with additional processing steps to produce the semiconductor structure. The semiconductor structure may be a part of a semiconductor device. Such devices are use in the manufacture of integrated circuits.

In some embodiments, the noble metal-containing material is deposited as a layer on a substrate. In some embodiments, the noble metal-containing layer comprises elemental noble metal. The thickness of a noble metal-containing material layer may be regulated by adjusting the cycle number of the cyclic deposition process. In some embodiments, the cyclic deposition process comprises providing the noble metal precursor and the second precursor alternately and sequentially into the reaction chamber. In some embodiments, the reaction chamber is purged between providing precursors into the reaction chamber. Examples of such cyclic deposition processes are atomic layer deposition and cyclic chemical vapor deposition.

As used herein, the term "substrate" may refer to any underlying material or materials that may be used to form, or upon which, a device, a circuit, material or a material layer may be formed. A substrate can include a bulk material, such as silicon (such as single-crystal silicon), other Group IV materials, such as germanium, or other semiconductor materials, such as a Group II-VI or Group III-V semiconductor materials. A substrate can include one or more layers overlying the bulk material. The substrate can include various topologies, such as gaps, including recesses, lines, trenches or spaces between elevated portions, such as fins, and the like formed within or on at least a portion of a layer of the substrate. Substrate may include nitrides, for example TiN, oxides, insulating materials, dielectric materials, conductive materials, metals, such as such as tungsten, ruthenium, molybdenum, cobalt, aluminum or copper, or metallic materials, crystalline materials, epitaxial, heteroepitaxial, and/or single crystal materials. In some embodiments of the current disclosure, the substrate comprises silicon. The substrate may comprise other materials, as described above, in addition to silicon. The other materials may form layers.

In the current disclosure, the deposition process comprises a cyclic deposition process, such as an atomic layer deposition (ALD) process or a cyclic chemical vapor deposition (CVD) process. The term "cyclic deposition process"

can refer to the sequential introduction of precursor(s) and/or reactant(s) into a reaction chamber to deposit material, such as noble metal, on a substrate. Cyclic deposition includes processing techniques such as atomic layer deposition (ALD), cyclic chemical vapor deposition (cyclic CVD), and hybrid cyclic deposition processes that include an ALD component and a cyclic CVD component. The process may comprise a purge step between providing precursors or between providing a precursor and a reactant in the reaction chamber.

The process may comprise one or more cyclic phases. For example, pulsing of a noble metal precursor and a second precursor may be repeated. Repeating the cyclic deposition steps may be used to control the thickness of the deposited material. In some embodiments, the process comprises one or more acyclic phases. In some embodiments, the deposition process comprises the continuous flow of at least one precursor. In some embodiments, a reactant may be continuously provided in the reaction chamber. In such an embodiment, the process comprises a continuous flow of a precursor or a reactant. In some embodiments, one or more of the precursors and/or reactants are provided in the reaction chamber continuously. A cyclic deposition process may usually be initiated with any of at least two precursors and/or reactants used in the process. Thus, in the current methods, the first deposition cycle may be started by providing either a noble metal precursor or a second precursor in the reaction chamber.

The term "atomic layer deposition" (ALD) can refer to a vapor deposition process in which deposition cycles, such as a plurality of consecutive deposition cycles, are conducted in a reaction chamber. The term atomic layer deposition, as used herein, is also meant to include processes designated by related terms, such as chemical vapor atomic layer deposition, when performed with alternating pulses of precursor (s)/reactant(s), and optional purge gas(es). Generally, for ALD processes, during each cycle, a precursor is introduced to a reaction chamber and is chemisorbed to a deposition surface (e.g., a substrate surface that may include a previously deposited material from a previous ALD cycle or other material), forming about a monolayer or sub-monolayer of material that does not readily react with additional precursor (i.e., a self-limiting reaction). Thereafter, in some cases, another precursor or a reactant may subsequently be introduced into the process chamber for use in converting the chemisorbed precursor to the desired material on the deposition surface. The second precursor or a reactant can be capable of further reaction with the precursor. Purging steps may be utilized during one or more cycles, e.g., during each step of each cycle, to remove any excess precursor from the process chamber and/or remove any excess second precursors, reactant and/or reaction byproducts from the reaction chamber. Thus, in some embodiments, the cyclic deposition process comprises purging the reaction chamber after providing a precursor into the reaction chamber. In some embodiments, the cyclic deposition process comprises purging the reaction chamber after providing a noble metal precursor into the reaction chamber. In some embodiments, the cyclic deposition process comprises purging the reaction chamber after providing a second precursor into the reaction chamber. In some embodiments, the cyclic deposition process comprises purging the reaction chamber after providing each precursor into the reaction chamber.

CVD type processes typically involve gas phase reactions between two or more precursors and/or reactants. The precursor(s) and reactant(s) can be provided simultaneously to the reaction space or substrate, or in partially or completely separated pulses. The substrate and/or reaction space can be heated to promote the reaction between the gaseous precursor and/or reactants. In some embodiments the precursor(s) and reactant(s) are provided until a layer having a desired thickness is deposited. In some embodiments, cyclic CVD processes can be used with multiple cycles to deposit a thin film having a desired thickness. In cyclic CVD processes, the precursors and/or reactants may be provided to the reaction chamber in pulses that do not overlap, or that partially or completely overlap.

As used herein, the term "purge" may refer to a procedure in which vapor phase precursors and/or vapor phase byproducts are removed from the substrate surface for example by evacuating the reaction chamber with a vacuum pump and/or by replacing the gas inside a reaction chamber with an inert or substantially inert gas such as argon or nitrogen. Purging may be effected between two pulses of gases which react with each other. However, purging may be effected between two pulses of gases that do not react with each other. For example, a purge, or purging may be provided between pulses of two precursors or between a precursor and a reactant. Purging may avoid or at least reduce gas-phase interactions between the two gases reacting with each other. It shall be understood that a purge can be effected either in time or in space, or both. For example in the case of temporal purges, a purge step can be used e.g., in the temporal sequence of providing a first precursor to a reactor chamber, providing a purge gas to the reactor chamber, and providing a second precursor to the reactor chamber, wherein the substrate on which a layer is deposited does not move. For example in the case of spatial purges, a purge step can take the following form: moving a substrate from a first location to which a first precursor is continually supplied, through a purge gas curtain, to a second location to which a second precursor is continually supplied. Purging times may be, for example, from about 0.01 seconds to about 20 seconds, from about 0.05 s to about 20 s, or from about 1 s to about 20 s, or from about 0.5 s to about 10 s, or between about 1 s and about 7 seconds, such as 1 s or 2 s. However, other purge times can be utilized if necessary, such as where highly conformal step coverage over extremely high aspect ratio structures or other structures with complex surface morphology is needed, or in specific reactor types, such as a batch reactor, may be used.

In some embodiments, the cyclic deposition process according to the current disclosure comprises a thermal deposition process. In thermal deposition, the chemical reactions may be promoted by increased temperature relevant to ambient temperature. Generally, temperature increase may provide the energy needed for the formation of noble metal-containing material in the absence of other external energy sources, such as plasma, radicals, or other forms of radiation. In some embodiments, the method according to the current disclosure is a plasma-enhanced deposition method, for example PEALD or PECVD.

The methods according to the current disclosure comprise providing a substrate in a reaction chamber, providing a noble metal precursor into the reaction chamber in a vapor phase, and providing a second precursor into the reaction chamber in a vapor phase to form noble metal-containing material on the substrate.

The method of depositing noble metal-containing material according to the current disclosure comprises providing a substrate in a reaction chamber. In other words, a substrate is brought into space where the deposition conditions can be controlled. The reaction chamber may be part of a cluster tool in which different processes are performed to form an integrated circuit. In some embodiments, the reaction chamber may be a flow-type reactor, such as a cross-flow reactor. In some embodiments, the reaction chamber may be a showerhead reactor. In some embodiments, the reaction chamber may be a space-divided reactor. In some embodiments, the reaction chamber may be single wafer ALD reactor. In some embodiments, the reaction chamber may be a high-volume manufacturing single wafer ALD reactor. In some embodiments, the reaction chamber may be a batch reactor for manufacturing multiple substrates simultaneously. A reaction chamber according to the current disclosure may further be a deposition station in a multi-station chamber.

Further, in the method according to the current disclosure, a noble metal precursor is provided into the reaction chamber in a vapor phase, and a second precursor is provided into the reaction chamber in a vapor phase to form a noble metal-containing material on the substrate.

In the method according to the current disclosure, the noble metal precursor may be in vapor phase when it is in a reaction chamber. The noble metal precursor may be partially gaseous or liquid, or even solid at some points in time prior to being provided in the reaction chamber. In other words, a noble metal precursor may be solid, liquid or gaseous, for example, in a precursor vessel or other receptacle before delivery in a reaction chamber. Various means of bringing the precursor in to gas phase can be applied when delivery into the reaction chamber is performed. Such means may include, for example, heaters, vaporizers, gas flow or applying lowered pressure, or any combination thereof. Thus, the method according to the current disclosure may comprise heating the noble metal precursor prior to providing it to the reaction chamber.

Noble metal halide compounds comprising phosphine adduct ligands may decompose at relatively low temperatures in view of conventional cyclic deposition processes. For example, trialkylphosphine-containing row 5 and 6 noble metal dihalides may begin to decompose at temperatures below 200° C. Some trialkylphosphine-containing row 5 and 6 noble metal dihalides may begin to decompose at temperatures below 150° C. However, the inventors have discovered that the noble metal halide compounds according to the current disclosure may be suitable, or even advantageous, for cyclic deposition processes at temperatures below about 190° C.

In some embodiments, the deposition of a noble metal-containing material according to the current disclosure is performed at a temperature below about 220° C., or below about 205° C., or below about 190° C. In some embodiments, the deposition is performed at a temperature from about 140° C. to about 200° C., for example from about 150° C. to about 190° C., such as at a temperature of about 170° C., about 180° C. or at about 190° C.

In some embodiments, a noble metal precursor is heated to at least 30° C., to at least 50° C., or to at least 70° C., or to at least 90° C. or to at least 100° C. or to at least 110° C. before providing it to the reaction chamber. In some embodiments, a noble metal precursor is heated to at least 120° C., or to at least 150° C. The heating may take place in a precursor vessel. In some embodiments, the noble metal precursor is heated to at most 180° C., or to at most 160° C., or to at most 150° C., or to at most 120° C., or to at most 100° C., or to at most 80° C., or to at most 60° C. before providing it to the reaction chamber. The injector system of a vapor deposition assembly may be heated to improve the vapor-phase delivery of the noble metal precursor to the reaction chamber.

In this disclosure, "gas" can include material that is a gas at normal temperature and pressure (NTP), a vaporized solid and/or a vaporized liquid, and can be constituted by a single gas or a mixture of gases, depending on the context. A noble metal precursor may be provided to the reaction chamber in gas phase. A second precursor may be provided to the reaction chamber in gas phase. The term "inert gas" can refer to a gas that does not take part in a chemical reaction and/or does not become a part of a layer to an appreciable extent. Exemplary inert gases include He and Ar and any combination thereof. In some cases, molecular nitrogen and/or hydrogen can be an inert gas. A gas other than a process gas, i.e., a gas introduced without passing through a precursor injector system, other gas distribution device, or the like, can be used for, e.g., sealing the reaction space, and can include a seal gas.

In some embodiments, the noble metal-containing material comprises elemental noble metal. Thus, the deposited noble metal may at least partly have an oxidation state of 0. In some embodiments, substantially all or all of the noble metal is deposited as elemental noble metal. In some embodiments, the deposited noble metal comprises, consists essentially of, or consists of elemental platinum. In some embodiments, the deposited noble metal comprises, consists essentially of, or consists of elemental palladium. In some embodiments, the deposited noble metal comprises, consists essentially of, or consists of elemental silver. In some embodiments, a layer consisting essentially of, or consisting of, elemental noble metal is deposited. In some embodiments, the noble metal according to the current disclosure is deposited as a layer, and the layer comprises substantial amounts of other elements in addition to the noble metal. In such embodiments, the noble metal may be present as elemental noble metal. In some embodiments, the noble metal deposited according to the current disclosure is present as an alloy with another metal.

In some embodiments, the noble metal deposited according to the current disclosure is present at least partially in an oxidation state other than 0. In some embodiments, the noble metal deposited according to the current disclosure forms a compound with another element. In some embodiments, the noble metal-containing material deposited according to the current disclosure comprises a noble metal oxide. In some embodiments, the noble metal-containing material deposited according to the current disclosure comprises a noble metal nitride. In some embodiments, the noble metal-containing material deposited according to the current disclosure comprises a noble metal silicide. In some embodiments, the noble metal-containing material deposited according to the current disclosure comprises a noble metal germanide. In some embodiments, the noble metal-containing material deposited according to the current disclosure comprises a noble metal sulfide. In some embodiments, the noble metal-containing material deposited according to the current disclosure comprises a noble metal selenide. In some embodiments, the noble metal-containing material deposited according to the current disclosure comprises a noble metal phosphide. In some embodiments, the noble metal-containing material deposited according to the current disclosure comprises a noble metal boride. In some embodiments, the noble metal-containing material according to the current disclosure comprises two or more of the above materials. For example, the noble metal-containing material may comprise elemental noble metal and a noble metal carbide, or elemental noble metal and a noble metal nitride, or a combination of a noble metal carbide and a noble metal nitride. In some embodiments, the noble metal-containing material comprises silver oxide, palladium oxide, platinum oxide or a combination thereof.

The growth rate of noble metal-containing material may be, for example from about 0.05 to about 1.5 Å/cycle. The growth rate and the layer properties may depend on the temperature at which the deposition process is performed. In some embodiments, the growth rate may be about 0.1 Å/cycle, or about 0.2 Å/cycle, or about 0.5 Å/cycle, or about 1 Å/cycle. The growth rate may vary during a deposition process.

The deposition cycle, comprising providing noble metal precursor into the reaction chamber (i.e. pulsing the noble metal precursor) and providing the second precursor into the reaction chamber (i.e. pulsing the second precursor), as well as optional purging phases, may be repeated, for example about 100 times, about 125 times, about 200 times, about 250 times, about 350 times, about 500 times, about 750 times, about 1,000 times or about 1,500 times. In some embodiments, the deposition cycle may be repeated for at least about 100 times, about 250 times, at least about 350 times, at least about 500 times, at least about 750 times, at least about 1,000 times or at least about 1,500 times.

The resistivity of a noble metal-containing material deposited as a layer depends on the material composition. Also, for a given material, such as elemental noble metal-containing material, the resistivity may depend on the process conditions, such as temperature and the growth rate of the layer. In embodiments, in which a noble metal-containing layer comprises mostly, or substantially only of elemental noble metal, the resistivity may be, for example, less than about 250 μΩ cm, such as less than about 230 μΩ cm, such as less than about 200 μΩ cm, for example between 180 and 250 μΩ cm, such as between 190 and 230 μΩ cm.

In some embodiments, the noble metal-containing material comprises elemental noble metal, and less than 20 at. % carbon. In some embodiments, the noble metal-containing layer comprises elemental noble metal, and less than 15 at. % carbon. In some embodiments, the noble metal-containing layer comprises elemental noble metal, and less than 10 at. % carbon. In some embodiments, the noble metal-containing material comprises elemental noble metal, and less than 2 at. % oxygen. In some embodiments, the noble metal-containing material comprises elemental noble metal, and less than 6 at. % phosphorus. In some embodiments, the noble metal-containing material comprises elemental noble metal, and less than 1 at. % nitrogen.

The terms "precursor" and "reactant" can refer to molecules (compounds or molecules comprising a single element) that participate in a chemical reaction that produces another compound. A precursor typically contains portions that are at least partly incorporated into the compound or element resulting from the chemical reaction in question. Such a resulting compound or element may be deposited on a substrate. A reactant may be an element or a compound that is not incorporated into the resulting compound or element to a significant extent. However, a reactant may also contribute to the resulting compound or element in certain embodiments.

As used herein, a "noble metal precursor" includes a gas or a material that can become gaseous and that can be represented by a chemical formula that includes a noble metal.

In the methods according to the current disclosure, the noble metal precursor comprises a noble metal halide compound comprising an organic phosphine adduct ligand.

In some embodiments, the noble metal of the noble metal halide compound is a row 5 noble metal. In some embodiments, the noble metal may be selected from a group consisting of ruthenium (Ru), rhodium (Rh), palladium (Pd), silver (Ag), osmium (Os), iridium (Ir), platinum (Pt) and gold (Au). In some embodiments, the noble metal is selected from a group consisting of palladium, silver and platinum.

In some embodiments, the noble metal of the noble metal halide compound has an oxidation state of +1, or +2, or +3. The halogen of the noble metal halide compound may be selected from a group consisting of fluorine (F), chlorine (Cl), bromine (Br) and iodine (I). In some embodiments, the halogen of the noble metal halide compound is selected from a group consisting of Cl and Br. In some embodiments, the noble metal halide comprises a compound selected from a group consisting of $PdCl_2$, $PdBr_2$, $PtCl_2$, $PtBr_2$, AgCl and AgBr. In some embodiments, the noble metal halide comprises a compound selected from a group consisting of $PdCl_2$ and $PdBr_2$.

The noble metal halide compound according to the current disclosure comprises an organic phosphine adduct ligand. An organic phosphine adduct ligand comprises a phosphorus (P) atom bonded to one or more organic ligands. In some embodiments, the phosphorus atom of the organic phosphine adduct ligand is bonded to at least one organic group. In some embodiments, the phosphorus atom of the organic phosphine adduct ligand is bonded to at least two organic groups. In some embodiments, the phosphorus atom of the organic phosphine adduct ligand is bonded to three organic groups. In some embodiments, the organic group is an alkyl group. In some embodiments, all of the organic groups bonded to the phosphorus atom are alkyl groups. In some embodiments, the alkyl groups are linear or branched alkyls. In some embodiments, the alkyl groups are not aromatic alkyl groups. In some embodiments, the alkyl groups are not cyclic alkyl groups. In some embodiments, the alkyl groups are cyclic alkyl groups.

In some embodiments, an alkyl group is a C1 to C4 alkyl. In some embodiments, an alkyl group is a C1 to C6 alkyl. In some embodiments, an alkyl group is an aryl. In some embodiments, the alkyl group is a cyclic aryl. In some embodiments, an alkyl group is selected from methyl, ethyl, n-propyl and isopropyl. In some embodiments, the phosphine adduct ligand is trimethyl phosphine. In some embodiments, the phosphine adduct ligand is triethyl phosphine. In some embodiments, the phosphine adduct ligand is tri-n-propyl phosphine. In some embodiments, the phosphine adduct ligand is triisopropyl phosphine. In some embodiments, the noble metal halide compound comprises two organic phosphine adduct ligands. In some embodiments, all organic ligands, such as C1 to C6 alkyl ligands, in a phosphine adduct ligand are identical. In some embodiments, the two organic phosphine adduct ligands are identical.

In some embodiments, the noble metal halide compound has the formula (I)

$$MX_y(PRR'R'')_z, \qquad (I)$$

wherein M is a noble metal selected from a group consisting of ruthenium (Ru), rhodium (Rh), palladium (Pd), silver (Ag), osmium (Os), iridium (Ir), platinum (Pt) and gold (Au); X is a halogen selected from F, Cl, Br and I; and R, R' and R" are each independently selected from C1 to C6 alkyls, y is an integer from 1 to 5, and z is an integer from 1 to 4. R, R' and R" might also be aryl or cyclic alkyl groups. In some embodiments, y is 2 and z is 2. In some embodiments, y is 3 and z is 2. In some embodiments, y is 3 and z is 3. In some embodiments, y is 1 and z is 3. In some embodiments, at least one of R, R' and R" is methyl. In some embodiments, at least one of R, R' and R" is ethyl. In some embodiments, at least one of R, R' and R" is n-propyl. In some embodiments, at least one of R, R' and R" is isopropyl. In some embodiments, R' and R" are identical. In some embodiments, all of R, R' and R" are identical. In such embodiments, the noble metal halide compound may be represented by formula (II).

In some embodiments, the noble metal halide compound has the formula (II)

$$MX_2(PR_3)_2, \quad (II)$$

wherein M is a noble metal selected from a group consisting of palladium (Pd) and platinum (Pt); X is a halogen selected from F, Cl, Br and I; and R is a C1 to C4 alkyl. In some embodiments, M is selected from Pd, Pt and Ag. In some embodiments, X is selected from Cl and Br. In some embodiments, R is selected from methyl and ethyl. In some embodiments, M is Pd, X is Cl and R is methyl. In some embodiments, M is Pd, X is Cl and R is ethyl. In some embodiments, M is Pd, X is Br and R is methyl. In some embodiments, M is Pd, X is Br and R is ethyl. In some embodiments, M is Pt, X is Cl and R is methyl. In some embodiments, M is Pt, X is Cl and R is ethyl. In some embodiments, M is Pt, X is Br and R is methyl. In some embodiments, M is Pt, X is Br and R is ethyl. In some embodiments, M is Ag, X is Cl and R is methyl. In some embodiments, M is Ag, X is Cl and R is ethyl. In some embodiments, M is Ag, X is Br and R is methyl. In some embodiments, M is Ag, X is Br and R is ethyl.

In some embodiments, the noble metal halide compound comprises, consists essentially of, or consists of dichlorobis(trimethylphosphine)palladium. In some embodiments, the noble metal halide compound comprises, consists essentially of or consists of dichlorobis(triethylphosphine)palladium. In some embodiments, the noble metal halide compound comprises, consists essentially of, or consists of dibromobis(trimethylphosphine)palladium. In some embodiments, the noble metal halide compound comprises, consists essentially of or consists of dibromobis(triethylphosphine)palladium. In some embodiments, the noble metal halide compound comprises, consists essentially of, or consists of dichlorobis(trimethylphosphine)platinum. In some embodiments, the noble metal halide compound comprises, consists essentially of or consists of dichlorobis(triethylphosphine)platinum. In some embodiments, the noble metal halide compound comprises, consists essentially of, or consists of dibromo-bis(trimethylphosphine)platinum. In some embodiments, the noble metal halide compound comprises, consists essentially of or consists of dibromobis(triethylphosphine)platinum. In some embodiments, the noble metal halide compound comprises, consists essentially of, or consists of chloro(trimethylphosphine)silver. In some embodiments, the noble metal halide compound comprises, consists essentially of or consists of chloro(triethylphosphine)silver. In some embodiments, the noble metal halide compound comprises, consists essentially of, or consists of bromo(trimethylphosphine)silver. In some embodiments, the noble metal halide compound comprises, consists essentially of or consists of bromo(triethylphosphine)silver.

In some embodiments, a noble metal precursor is provided in a mixture of two or more compounds. In a mixture, the other compounds in addition to the noble metal precursor may be inert compounds or elements. In some embodiments, noble metal precursor is provided in a composition. Compositions suitable for use as composition can include a noble metal compound and an effective amount of one or more stabilizing agents. Composition may be a solution or a gas in standard conditions. In some embodiments, a mixture of at least two noble metals may be deposited. In such embodiments, the noble metal precursor may comprise two different noble metal-containing compounds, one or more of them being noble metal halide compounds according to the current disclosure.

The noble metal-containing material is formed by providing a second precursor into the reaction chamber in a vapor phase. The conversion of a noble metal precursor to the desired noble metal-containing material may take place at the substrate surface. In some embodiments, the conversion may take place at least partially in the gas phase. In some embodiments, the reactions between the noble metal precursor and the second precursor take place substantially only on the surface of the substrate.

In some embodiments, the second precursor is a reducing agent. A reducing agent may reduce the noble metal of the noble metal precursor into elemental metal. In some embodiments, the reducing agent is selected from a group consisting of forming gas ($H_2$+$N_2$), ammonia ($NH_3$), $NH_3$ plasma, a hydrazine (such as hydrazine ($N_2H_4$), tert-butyl hydrazine ($tBuHNNH_2$) and 1,1'-dimethylhydrazine ($Me_2NNH_2$)), molecular hydrogen ($H_2$), hydrogen atoms (H), a hydrogen plasma, hydrogen radicals, hydrogen excited species, an alcohol (such as MeOH), an aldehyde, a carboxylic acid (such as formic acid), a borane (such as borane ($BH_3$), diborane ($B_2H_6$), borane dimethylamine ($BH_3(NHMe_2)$)), an amine (such as tert-butylamine (tBu)$NH_2$, diethylamine ($Et_2NH$)), a silane (such as silane ($SiH_4$), disilane ($Si_2H_6$), trisilane ($Si_3H_8$)), germane (such as germane ($GeH_4$) and digermane ($Ge_2H_6$)), 1,4-bis(trimethylgermyl)-1,4-dihydropyrazine and 1,4-bis(trimethylsilyl)-1,4-dihydropyrazine. Many of the reducing agents listed above may work only with certain noble metal precursors. Thus, the listed compounds may not function as general reducing agents.

In some embodiments, the second precursor is an oxygen precursor, a nitrogen precursor, a carbon precursor, a silicon precursor, sulfur precursor, selenium precursor, phosphorus precursor or a boron precursor.

In some embodiments, the second precursor is a nitrogen precursor. In such embodiments, a noble metal nitride is deposited on the substrate. In some embodiments, the second precursor is a nitrogen precursor selected from a group consisting of the nitrogen precursor is selected from a group consisting of $NH_3$, $NH_2NH_2$, and mixture of gaseous $H_2$ and $N_2$. In some embodiments, the second precursor is a nitrogen precursor, and the noble metal-containing material comprises a noble metal nitride. Certain compounds, such as $NH_3$, may function as a reducing agent or as a nitrogen precursor. The function of such a precursor depends on the process conditions, which again may be adjusted accordingly by those skilled in the art.

In some embodiments, the second precursor is an oxygen precursor. In some embodiments, the oxygen precursor is selected from a group consisting of ozone ($O_3$), molecular oxygen ($O_2$), oxygen atoms (O), an oxygen plasma, oxygen radicals, oxygen excited species, water ($H_2O$), and hydrogen peroxide ($H_2O_2$). In some embodiments, the second precursor is an oxygen precursor, and the noble metal-containing material comprises a noble metal oxide. In some embodiments, the noble metal oxide comprises, consists essentially of, or consists of copper oxide. In some embodiments, the noble metal oxide comprises, consists essentially of, or consists of nickel oxide. In some embodiments, the noble metal oxide comprises, consists essentially of, or consists of cobalt oxide.

In some embodiments, the second precursor is a sulfur precursor or a selenium precursors. Thus, in some embodiments, a second precursor comprises S or Se. In some embodiments, a second precursor comprises S. In some embodiments, a second precursor does not comprise S. In some embodiments the second precursor may comprise an elemental chalcogen, such as elemental sulfur. In some embodiments, a second precursor comprises Se. In some embodiments, a second precursor does not comprise Se. In some embodiments, a second precursor comprises a compound having the formula (III):

$$H_2S_n, \quad \text{(III)}$$

wherein n is from 4 to 10.

In some embodiments, a second precursor may comprise at least one chalcogen-hydrogen bond (i.e. a bond between hydrogen and selenium or sulfur). In some embodiments the second precursor may comprise a chalcogen plasma, chalcogen atoms or chalcogen radicals. In some embodiments, where an energized second precursor is desired, a plasma may be generated in the reaction chamber or upstream of the reaction chamber. In some embodiments the second precursor does not comprise an energized second precursor, such as plasma, atoms or radicals. In some embodiments the second precursor may comprise a chalcogen plasma, chalcogen atoms or chalcogen radicals formed from a second precursor comprising a chalcogen-hydrogen bond, such as $H_2S$. In some embodiments a second precursor may comprise a chalcogen plasma, chalcogen atoms or chalcogen radicals such as a plasma comprising sulfur or selenium. In some embodiments, the plasma, atoms or radicals comprise selenium.

Noble metal compounds, such as nitrides and sulfides may exist in various phases. It depends on the process specifics which phase(s) will be formed during deposition. For clarity, noble metal oxide according to the current disclosure can mean any phase or mixture of phases.

Similarly to the noble metal precursor, a second precursor may be heated before providing it to the reaction chamber. The temperature to which the second precursor is heated depends on the properties of the second precursor. As is understood by those skilled in the art, the vaporization temperatures of the noble metal precursor and the second precursors may need to be compatible.

In some embodiments, a second precursor is heated to at least 30° C., to at least 50° C., or to at least 70° C., or to at least 90° C. or to at least 100° C. or to at least 110° C. before providing it to the reaction chamber. The heating may take place in a precursor vessel. In some embodiments, the second precursor is heated to at most 120° C., or to at most 100° C., or to at most 80° C., or to at most 60° C. before providing it to the reaction chamber. The injector system of a vapor deposition assembly may be heated to improve the vapor-phase delivery of the second precursor to the reaction chamber.

In one aspect of the invention there is a composition for depositing noble metal-containing material on a substrate, the composition comprising a noble metal halide compound comprising an organic phosphine adduct ligand. In one embodiment, the noble halide compound comprises at least two organic phosphine adduct ligands. In one embodiment, the at least two organic phosphine adduct ligands are identical. In one embodiment, wherein the phosphine adduct ligands are monophosphine ligands. In one embodiment, the phosphorous atom of the organic phosphine adduct ligand is bonded to at least one organic group. In one embodiment, the phosphorous atom of the organic phosphine adduct ligand is bonded to at least two organic groups. In one embodiment, the phosphorous atom of the organic phosphine adduct ligand is bonded to three organic groups. In one embodiment, the organic group is an alkyl group. In one embodiment, the alkyl group is a C1 to C6 alkyl. In one embodiment, the alkyl group is selected from methyl, ethyl, n-propyl and isopropyl. In one embodiment, the phosphine adduct ligand is trimethyl phosphine. In one embodiment, the halogen of the noble metal halide compound is selected from the group consisting of chlorine and bromine.

In one aspect of the invention, there is a method of producing a composition according the current the disclosure. The method comprises mixing a noble metal halide with a solvent and adding a phosphine compound to obtain a noble metal halide compound comprising an organic phosphine adduct ligand. In one embodiment, the noble metal halide comprises a compound selected from the group consisting of $PdCl_2$, $PdBr_2$, $PtCl_2$, $PtBr_2$, AgCl and AgBr. In one embodiment, the solvent is selected from the group consisting of tetrahydrofuran, dichlormethane, ethanol, isopropanol and butanol. In one embodiment, the phosphine compound is trimethylphosphine or triethylphosphine.

In an exemplary deposition process, elemental (i.e. metallic) palladium was deposited using dichlorobis(triethylphosphine)palladium as the noble metal precursor and 1,4-bis(trimethylsilyl)-1,4-dihydropyrazine as the second precursor. In the example, the second precursor was a reducing agent able to reduce the palladium of the noble metal precursor into elemental metal. In the example, a flow-type (i.e. cross-flow) ALD reactor was used. The pressure inside the reactor was from about 0.5 Torr to about 10 Torr during the process. The deposition process was performed at a temperature from about 150° C. to about 200° C., such as at from about 160° C. to about 190° C. In an exemplary deposition process, a temperature of 180° C. was used. The noble metal precursor was provided in the reaction chamber (i.e. pulsed) from about 0.5 seconds to about 5 seconds, such as for 3 about second. The second precursor may be provided into the reaction chamber for about 0.5 seconds to about 2 seconds, such as for 1 about seconds. The process comprised a purge phase after each precursor pulsing phase. $N_2$ (5.0) was used as a carrier gas and as a purge gas. The noble metal precursor was vaporized at a temperature of 130° C., and the second precursor was vaporized at a temperature of 40° C. Deposition was performed on soda lime glass and on silicon substrates with a native oxide layer. The growth rate of the noble metal-containing material, which in this case is comprised substantially only elemental palladium, was approximately 0.4 Å/cycle. Palladium metal-containing layers may be obtained by the process, and the thickness of the layer depends on the number of pulsing cycles. For example, layers having thickness of at least 15 nm, such as at least 20 nm may be obtained.

In the exemplary process, the deposited noble metal-containing material comprised cubic palladium metal, as analyzed via XRD measurements. The resistivity of the palladium-containing layers was approximately between 190 and 230 μΩ cm. A conductive layer could be achieved at a layer thickness of about 6 nm and the layers were mostly pinhole-free when they exceeded 23 nm in thickness. Based on SEM imaging, the grain size was deemed small, and the layers to be relatively smooth.

The deposited noble metal-containing material comprised about 77 at. % palladium, about 14 at. % carbon and about 5 at. % phosphorous. There were only small amounts of other elements. The lack of chlorine indicates efficient reduction of the noble metal precursor.

A noble metal halide compound may be synthesized by mixing the noble metal halide in question, for example $PdCl_2$, $PdBr_2$, $PtCl_2$, $PtBr_2$, AgCl or AgBr, into a suitable solvent, such as tetrahydrofuran, dichlormethane, ethanol, isopropanol or butanol. Then, a phosphine compound, such as trimethylphosphine or triethylphosphine, may be added. In some cases mixing at room temperature for a suitable length of time is enough. In other cases refluxing for a suitable length of time (e.g. 2 to 20 hours) is needed. The noble metal halogen compound comprising an organic phosphine adduct ligand may be purified by removing any undissolved solids by appropriate means (such as filtering), and evaporating the solvent. Further purification may be done by vacuum sublimation.

In some embodiments, a noble metal-containing layer comprises an elemental noble metal, such as Pd, Pt or Ag.

In some embodiments, there is provided a vessel containing the noble metal compound synthesized according to the current disclosure. A chemical reactant delivery system for vapor deposition can include a reactant vessel for providing a reactant into a reaction chamber. The reactant delivery system may comprise a heating means including a heater, such as a radiant heat lamps, resistive heaters etc. In some embodiments, the heating means may be adapted to heat the reactant vessel to a temperature from about 40° C. to about 180° C., such as to about 70° C., 85° C., 90° C., 100° C., 110° C., 120° C. or 140° C. In some embodiments, the heating means may be adapted to heat the reactant vessel to a temperature from about 50° C. to about 180° C. In some embodiments, the heating means may be adapted to heat the reactant vessel to a temperature from about 60° C. to about 180° C. In some embodiments, the heating means may be adapted to heat the reactant vessel to a temperature from about 80° C. to about 150° C. In some embodiments, the heating means may be adapted to heat the reactant vessel to a temperature from about 100° C. to about 140° C. In some embodiments, the heating means may be adapted to heat the reactant vessel to a temperature from about 40° C. to about 180° C. In some embodiments, the heating means may be adapted to heat the reactant vessel to a temperature from about 40° C. to about 130° C. In some embodiments, the heating means may be adapted to heat the reactant vessel to a temperature from about 40° C. to about 80° C. In some embodiments, the heating means may be adapted to heat the reactant vessel to a temperature from about 40° C. to about 70° C.

The reactant vessel includes the solid composition according to the current disclosure. The heater heats up the reactant vessel to vaporize the reactant in the reactant vessel. The reactant vessel can have an inlet and an outlet for the flow of a carrier gas (e.g., $N_2$) through the reactant vessel. The carrier gas may be an inert gas. The carrier gas may sweep reactant vapor, for example sublimated reactant, along with it through the reactant vessel outlet and ultimately to a substrate in a reaction chamber. The reactant vessel typically includes isolation valves for fluidly isolating the contents of the reactant vessel from the vessel exterior. One isolation valve may be provided upstream of the reactant vessel inlet, and another isolation valve may be provided downstream of the reactant vessel outlet.

The composition according to the current disclosure may be solid at standard pressure and temperature. Depending on the application, the composition may be heated and/or maintained at very low pressures to produce a sufficient amount of reactant vapor for the vapor deposition process. Once vaporized (sublimed), it is important that the vapor phase reactant is kept at or above the vaporizing temperature through the processing system so as to prevent undesirable condensation in the valves, filters, conduits, and other components associated with delivering the vapor phase reactants into the reaction chamber.

A reactant vessel may be supplied with gas lines extending from the inlet and outlet, isolation valves on the lines, and fittings on the valves, the fittings being configured to connect to the gas flow lines of the remaining vapor deposition assembly. It is often desirable to provide a number of additional heaters for heating the various valves and gas flow lines between the reactant vessel and the reaction chamber, to prevent the reactant vapor from condensing and depositing on such components. Accordingly, the gas-conveying components between the reactant vessel and the reaction chamber are sometimes referred to as a "hot zone" in which the temperature is maintained above the vaporization/condensation/sublimation temperature of the reactant.

In some embodiments, a reactant vessel according to the current disclosure is configured and arranged for use in a vapor deposition assembly. In some embodiments, a reactant vessel according to the current disclosure contains dichlorobis(triethylphosphine)palladium. In some embodiments, a chemical reactant vessel according to the current disclosure contains dichlorobis(triethylphosphine)platinum. In some embodiments, a chemical reactant vessel according to the current disclosure contains chlorobis(triethylphosphine)silver.

In still another aspect, a vapor deposition assembly comprising a reactant vessel according to the current disclosure is disclosed. The vapor deposition assembly includes a reaction chamber for depositing a noble metal-containing material on a substrate and a second precursor delivery system comprising a reactant vessel according to the current disclosure connected to the reaction chamber to supply the noble metal precursor according to the current disclosure into the reaction chamber.

The vapor deposition assembly for depositing noble metal-containing material on a substrate comprises one or more reaction chambers constructed and arranged to hold the substrate and a precursor injector system constructed and arranged to provide a metal alkyl precursor according to the current disclosure into the reaction chamber in a vapor phase. The vapor deposition assembly further comprises a reactant vessel constructed and arranged to contain a composition according to the current disclosure and the assembly is constructed and arranged to provide a composition according to the current disclosure via the precursor injector system to the reaction chamber to deposit noble metal-containing material on the substrate.

In some embodiments, the vapor deposition assembly may additionally include control processors and software configured to operate the reaction chamber to perform an ALD process. In some embodiments, the vapor deposition assembly may additionally include control processors and software configured to operate the reaction chamber to perform a CVD process.

The disclosure is further explained by the following exemplary embodiments depicted in the drawings. The illustrations presented herein are not meant to be actual views of any particular material, structure, device or an apparatus, but are merely schematic representations to describe embodiments of the current disclosure. It will be appreciated that elements in the figures are illustrated for simplicity and clarity and have not necessarily been drawn to scale. For example, the dimensions of some of the elements in the figures may be exaggerated relative to other elements to help improve the understanding of illustrated embodiments of the present disclosure. The structures and devices depicted in the drawings may contain additional elements and details, which may be omitted for clarity.

The particular implementations shown and described are illustrative of the invention and are not intended to otherwise limit the scope of the aspects and implementations in any way. Indeed, for the sake of brevity, conventional manufacturing, connection, preparation, and other functional aspects of the system may not be described in detail. Furthermore, the connecting lines shown in the various figures are intended to represent exemplary functional relationships and/or physical couplings between the various elements. Many alternative or additional functional relationship or physical connections may be present in the practical system, and/or may be absent in some embodiments.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. Thus, the various acts illustrated may be performed in the sequence illustrated, in other sequences, or omitted in some cases.

The subject matter of the present disclosure includes all novel and nonobvious combinations and subcombinations of the various processes, systems, and configurations, and other features, functions, acts, and/or properties disclosed herein, as well as any and all equivalents thereof.

FIGS. 1A and 1B illustrate a block diagram of an exemplary embodiment of a method 100 of depositing noble metal-containing material on a substrate. In the first phase 102, a substrate is provided into a reaction chamber. A substrate according to the current disclosure may comprise, for example, an oxide, such as silicon oxide (for example thermal silicon oxide or native silicon oxide). A substrate may comprise a nitride, such as silicon nitride or titanium nitride, a metal, such as copper, cobalt or tungsten, chalcogenide material, such as molybdenum sulfide. The noble metal-containing material according to the current disclosure may be deposited on said surfaces.

The reaction chamber can form part of an atomic layer deposition (ALD) assembly. The reaction chamber can form part of a chemical vapor deposition (CVD) assembly. The assembly may be a single wafer reactor. Alternatively, the reactor may be a batch reactor. The assembly may comprise one or more multi-station deposition chambers. Various phases of method 100 can be performed within a single reaction chamber or they can be performed in multiple reaction chambers, such as reaction chambers of a cluster tool. In some embodiments, the method 100 is performed in a single reaction chamber of a cluster tool, but other, preceding or subsequent, manufacturing steps of the structure or device are performed in additional reaction chambers of the same cluster tool. Optionally, an assembly including the reaction chamber can be provided with a heater to activate the reactions by elevating the temperature of one or more of the substrate and/or the reactants and/or precursors. The noble metal-containing material according to the current disclosure may be deposited in a cross-flow reaction chamber. The noble metal-containing material according to the current disclosure may be deposited in a showerhead reaction chamber.

Noble metal precursor is provided in the reaction chamber containing the substrate 104. Without limiting the current disclosure to any specific theory, noble metal precursor may chemisorb on the substrate during providing noble metal precursor into the reaction chamber. The duration of providing noble metal precursor into the reaction chamber (noble metal precursor pulse time) may be, for example, 0.5 seconds, 1 second, 1.5 seconds, 2 seconds, 3 seconds, 4 seconds or 5 seconds.

In the second deposition phase 106 of a method 100, a second precursor is provided in the reaction chamber. In some embodiments, the second precursor comprises a reducing agent for depositing elemental noble metal on the substrate. In some embodiments, the second precursor comprises an oxygen precursor for depositing noble metal oxide on the substrate. In some embodiments, the second precursor comprises a nitrogen precursor for depositing noble metal nitride on the substrate. In some embodiments, the second precursor comprises a carbon precursor for depositing noble metal carbide on the substrate. In some embodiments, the second precursor comprises a silicon precursor for depositing noble metal silicide on the substrate. In some embodiments, the second precursor comprises a chalcogen precursor (such as sulfur or selenium precursor) for depositing noble metal chalcogenide, such as a noble metal sulfide or a noble metal selenide, on the substrate. In some embodiments, the second precursor comprises a phosphorus precursor for depositing noble metal phosphide on the substrate.

Phases of providing a noble metal precursor 104 and providing a second precursor 106 may be performed in any order. The phases of providing a noble metal precursor 104 and providing a second precursor 106 may constitute a deposition cycle, resulting in the deposition of noble metal-containing material. In some embodiments, the two phases of noble metal-containing material deposition, namely providing the noble metal precursor and the second precursor in the reaction chamber (104 and 106), may be repeated (loop 108). Such embodiments contain several deposition cycles. The thickness of the deposited noble metal-containing material may be regulated by adjusting the number of deposition cycles. The deposition cycle (loop 108) may be repeated until a desired noble metal-containing material thickness is achieved. For example, about 50, 100, 200, 300, 400, 500, 700, 800, 1,000, 1,200, 1,500, 2,000, 2,400 or 3,000 deposition cycles may be performed. The cyclical deposition may result in the formation of a noble metal-containing layer. The layer may be substantially continuous or continuous.

In some embodiments, the cyclic deposition process comprises providing the noble metal precursor and the second precursor alternately and sequentially in the reaction chamber. In some embodiments, the reaction chamber is purged between precursors, 105, 107, as depicted in FIG. 1B. In such embodiments, a deposition cycle may be considered to contain phases 104, 105, 106 and 107. As above, a deposition cycle may be repeated 108 a number of times to achieve desired noble metal-containing material thickness.

Noble metal precursor and second precursor may be provided in the reaction chamber in separate steps (104 and 106). FIG. 1B illustrates an embodiment according to the current disclosure, where steps 104 and 106 are separate by purge steps 105 and 107. In such embodiments, a deposition cycle comprises one or more purge steps 103, 105. During purge steps, precursor and/or reactant can be temporally separated from each other by inert gases, such as argon (Ar), nitrogen (N2) or helium (He) and/or a vacuum pressure. The separation of noble metal precursor and second precursor may alternatively be spatial.

Purging the reaction chamber 103, 105 may prevent or mitigate gas-phase reactions between a noble metal precursor and a second precursor, and enable possible self-saturating surface reactions. Surplus chemicals and reaction byproducts, if any, may be removed from the substrate surface, such as by purging the reaction chamber or by moving the substrate, before the substrate is contacted with the next reactive chemical. In some embodiments, however, the substrate may be moved to separately contact a noble metal precursor and a second precursor. Because in some embodiments, the reactions may self-saturate, strict temperature control of the substrates and precise dosage control of the precursors may not be required. However, the substrate temperature is preferably such that an incident gas species does not condense into monolayers or multimonolayers nor thermally decompose on the surface.

When performing the method 100, noble metal-containing material is deposited onto the substrate. The deposition process may be a cyclical deposition process, and may include cyclical CVD, ALD, or a hybrid cyclical CVD/ALD process. For example, in some embodiments, the growth rate of a particular ALD process may be low compared with a CVD process. One approach to increase the growth rate may be that of operating at a higher deposition temperature than that typically employed in an ALD process, resulting in some portion of a chemical vapor deposition process, but still taking advantage of the sequential introduction of a noble metal precursor and a second precursor. Such a process may be referred to as cyclical CVD. In some embodiments, a cyclical CVD process may comprise the introduction of two or more precursors into the reaction chamber, wherein there may be a time period of overlap between the two or more precursors in the reaction chamber resulting in both an ALD component of the deposition and a CVD component of the deposition. This is referred to as a hybrid process. In accordance with further examples, a cyclical deposition process may comprise the continuous flow of one reactant or precursor and the periodic pulsing of the other chemical component into the reaction chamber. The temperature and/or pressure within a reaction chamber during step 104 can be the same or similar to any of the pressures and temperatures noted above in connection with step 102.

In some embodiments, the noble metal precursor is brought into contact with a substrate surface 104, excess noble metal precursor is partially or substantially completely removed by an inert gas or vacuum 105, and second precursor is brought into contact with the substrate surface comprising noble metal precursor. Noble metal precursor may be brought in to contact with the substrate surface in one or more pulses 104. In other words, pulsing of the noble metal precursor 104 may be repeated. The noble metal precursor on the substrate surface may react with the second precursor to form noble metal-containing material on the substrate surface. Also pulsing of the second precursor 106 may be repeated. In some embodiments, second precursor may be provided in the reaction chamber first 106. Thereafter, the reaction chamber may be purged 105 and noble metal precursor provided in the reaction chamber in one or more pulses 104.

FIG. 2 illustrates a deposition assembly 200 according to the current disclosure in a schematic manner. Deposition assembly 200 can be used to perform a method as described herein and/or to form a structure or a device, or a portion thereof as described herein.

In the illustrated example, deposition assembly 200 includes one or more reaction chambers 202, a precursor injector system 201, a noble metal precursor vessel 204, a second precursor vessel 206, an exhaust source 210, and a controller 212. The deposition assembly 200 may comprise one or more additional gas sources (not shown), such as an inert gas source, a carrier gas source and/or a purge gas source.

Reaction chamber 202 can include any suitable reaction chamber, such as an ALD or CVD reaction chamber as described herein.

The noble metal precursor vessel 204 can include a vessel and one or more noble metal precursors as described herein—alone or mixed with one or more carrier (e.g., inert) gases. A second precursor vessel 206 can include a vessel and a second precursor as described herein—alone or mixed with one or more carrier gases. Although illustrated with two source vessels 204, 206, deposition assembly 200 can include any suitable number of source vessels. Source vessels 204, 206 can be coupled to reaction chamber 202 via lines 214,216, which can each include flow controllers, valves, heaters, and the like. In some embodiments, the noble metal precursor in the noble metal precursor vessel 204 and the second precursor in the second precursor vessel 206 may be heated. In some embodiments, a vessel is heated so that a precursor or a reactant reaches a temperature between, for example, about 30° C. and about 200° C., depending on the properties of the chemical in question.

Exhaust source 210 can include one or more vacuum pumps.

Controller 212 includes electronic circuitry and software to selectively operate valves, manifolds, heaters, pumps and other components included in the deposition assembly 200. Such circuitry and components operate to introduce precursors, reactants and purge gases from the respective sources. Controller 212 can control timing of gas pulse sequences, temperature of the substrate and/or reaction chamber 202, pressure within the reaction chamber 202, and various other operations to provide proper operation of the deposition assembly 200. Controller 212 can include control software to electrically or pneumatically control valves to control flow of precursors, reactants and purge gases into and out of the reaction chamber 202. Controller 212 can include modules such as a software or hardware component, which performs certain tasks. A module may be configured to reside on the addressable storage medium of the control system and be configured to execute one or more processes.

Other configurations of deposition assembly 200 are possible, including different numbers and kinds of precursor and reactant sources. Further, it will be appreciated that there are many arrangements of valves, conduits, precursor sources, and auxiliary reactant sources that may be used to accomplish the goal of selectively and in coordinated manner feeding gases into reaction chamber 202. Further, as a schematic representation of a deposition assembly, many components have been omitted for simplicity of illustration, and such components may include, for example, various valves, manifolds, purifiers, heaters, containers, vents, and/or bypasses.

During operation of deposition assembly 200, substrates, such as semiconductor wafers (not illustrated), are transferred from, e.g., a substrate handling system to reaction chamber 202. Once substrate(s) are transferred to reaction chamber 202, one or more gases from gas sources, such as precursors, reactants, carrier gases, and/or purge gases, are introduced into reaction chamber 202.

In some embodiments, the noble metal precursor is supplied in pulses, the second precursor is supplied in pulses and the reaction chamber is purged between consecutive pulses of a noble metal precursor and a second precursor.

The example embodiments of the disclosure described above do not limit the scope of the invention, since these embodiments are merely examples of the embodiments of the invention, which is defined by the appended claims and their legal equivalents. Any equivalent embodiments are intended to be within the scope of this invention. Various modifications of the disclosure, in addition to those shown and described herein, such as alternative useful combinations of the elements described, may become apparent to those skilled in the art from the description. Such modifications and embodiments are also intended to fall within the scope of the appended claims.

The invention claimed is:

1. A method of depositing noble metal-containing material on a substrate by a cyclic deposition process, the method comprising:

providing a substrate in a reaction chamber;

providing a noble metal precursor into the reaction chamber in a vapor phase; and providing a second precursor into the reaction chamber in a vapor phase to form noble metal-containing material on the substrate; wherein the noble metal precursor comprises a noble metal halide compound comprising an organic phosphine adduct ligand.

2. The method of claim 1, wherein the noble metal halide compound comprises at least two organic phosphine adduct ligands.

3. The method of claim 2, wherein the at least two organic phosphine adduct ligands are identical.

4. The method of claim 2, wherein the at least two organic phosphine adduct ligands are monophosphine ligands.

5. The method of claim 1, wherein a phosphorous atom of the organic phosphine adduct ligand is bonded to at least one organic group.

6. The method of claim 5, wherein the phosphorous atom of the organic phosphine adduct ligand is bonded to at least two organic groups.

7. The method of claim 5, wherein the phosphorous atom of the organic phosphine adduct ligand is bonded to three organic groups.

8. The method of claim 5, wherein the at least one organic group is an alkyl group.

9. The method of claim 8, wherein the alkyl group is a C1 to C6 alkyl.

10. The method of claim 9, wherein the alkyl group is selected from the group consisting of methyl, ethyl, n-propyl, and isopropyl.

11. The method of claim 1, wherein the organic phosphine adduct ligand is trimethyl phosphine.

12. The method of claim 1, wherein the halogen of the noble metal halide compound is selected from the group consisting of chlorine and bromine.

13. The method of claim 1, wherein the noble metal of the noble metal halide compound is selected from the group consisting of palladium, gold, platinum, silver, ruthenium, rhodium, osmium, and iridium.

14. The method of claim 13, wherein the noble metal of the noble metal halide compound is selected from the group consisting of palladium, platinum, and silver.

15. The method of claim 14, wherein the noble metal of the noble metal halide compound is palladium.

16. The method of claim 1, wherein the noble metal halide compound is selected from the group consisting of dichlorobis(triethylphosphine)palladium and dichlorobis(triethylphosphine)platinum.

17. The method of claim 1, wherein the second precursor is a reducing agent.

18. The method of claim 17, wherein the reducing agent is selected from the group consisting of forming gas ($H_2$+$N_2$), ammonia ($NH_3$), $NH_3$ plasma, a hydrazine, molecular hydrogen ($H_2$), hydrogen atoms (H), a hydrogen plasma, hydrogen radicals, hydrogen excited species, an alcohol, an aldehyde, a carboxylic acid, a borane, an amine, a silane, a germane, 1,4-bis(trimethylgermyl)-1,4-dihydropyrazine, and 1,4-bis(trimethylsilyl)-1,4-dihydropyrazine.

19. The method according to claim 1, wherein the noble metal-containing material comprises elemental noble metal.

20. The method according to claim 1, wherein the second precursor is an oxygen precursor, a nitrogen precursor, a carbon precursor, a silicon precursor, a sulfur precursor, a selenium precursor, a phosphorous precursor, or a boron precursor.

21. The method of claim 20, wherein the second precursor is an oxygen precursor selected from the group consisting of ozone ($O_3$), molecular oxygen ($O_2$), oxygen atoms (O), an oxygen plasma, oxygen radicals, oxygen excited species, water ($H_2O$), and hydrogen peroxide ($H_2O_2$).

22. The method of claim 20, wherein the second precursor is an oxygen precursor, and the noble metal-containing material comprises a noble metal oxide.

23. The method of claim 20, wherein the second precursor is selected from the group consisting of $NH_3$, $NH_2NH_2$, and a mixture of gaseous $H_2$ and $N_2$.

24. The method of claim 20, wherein the second precursor is a nitrogen precursor, and the noble metal-containing material comprises a noble metal nitride.

25. The method of claim 1, wherein the deposition is performed at a temperature below 200° C.

26. The method of claim 1, wherein the reaction chamber is purged between providing precursors into the reaction chamber.

* * * * *